(12) United States Patent
Eguchi et al.

(10) Patent No.: US 7,329,901 B2
(45) Date of Patent: Feb. 12, 2008

(54) THIN-FILM SEMICONDUCTOR DEVICE, ELECTRO-OPTICAL DEVICE, AND ELECTRONIC APPARATUS

(75) Inventors: Tsukasa Eguchi, Showa-cho (JP); Hiroshi Sera, Chino (JP)

(73) Assignee: Seiko Epson Corporation, Tokyo (JP)

( * ) Notice: Subject to any disclaimer, the term of this patent is extended or adjusted under 35 U.S.C. 154(b) by 283 days.

(21) Appl. No.: 11/195,769

(22) Filed: Aug. 3, 2005

(65) Prior Publication Data
US 2006/0076560 A1  Apr. 13, 2006

(30) Foreign Application Priority Data
Sep. 29, 2004  (JP) .............................. 2004-283652

(51) Int. Cl.
*H01L 29/04* (2006.01)
(52) U.S. Cl. .................. 257/59; 257/72; 257/E27.1
(58) Field of Classification Search .................. 257/59, 257/72, 57, 70, 350, 351, E27.1, E27.112, 257/E27.125
See application file for complete search history.

(56) References Cited

U.S. PATENT DOCUMENTS 7,001,801 B2 * 2/2006 Yamazaki et al. .......... 438/149

\* cited by examiner

*Primary Examiner*—Howard Weiss
*Assistant Examiner*—(Vikki) Hoa B Trinh
(74) *Attorney, Agent, or Firm*—Oliff & Berridge, PLC.

(57) ABSTRACT

A thin-film semiconductor device includes, on the same substrate, a thin-film transistor, in which an active layer, a gate insulating film, and a gate electrode are laminated, and a capacitive element, in which a first electrode formed using a semiconductor film formed on the same layer as the active layer, a dielectric film formed on the same layer as the gate insulating film, and a second electrode formed on the same layer as the gate electrode are laminated. In the capacitive element, in plan view, the dielectric film has a first region that is formed in a region inside outer circumferences of the first and second electrodes and that has a film thickness smaller than that of the gate insulating film, and a second region that is formed in a region outside the first region and that has a film thickness larger than that of the first region.

9 Claims, 11 Drawing Sheets

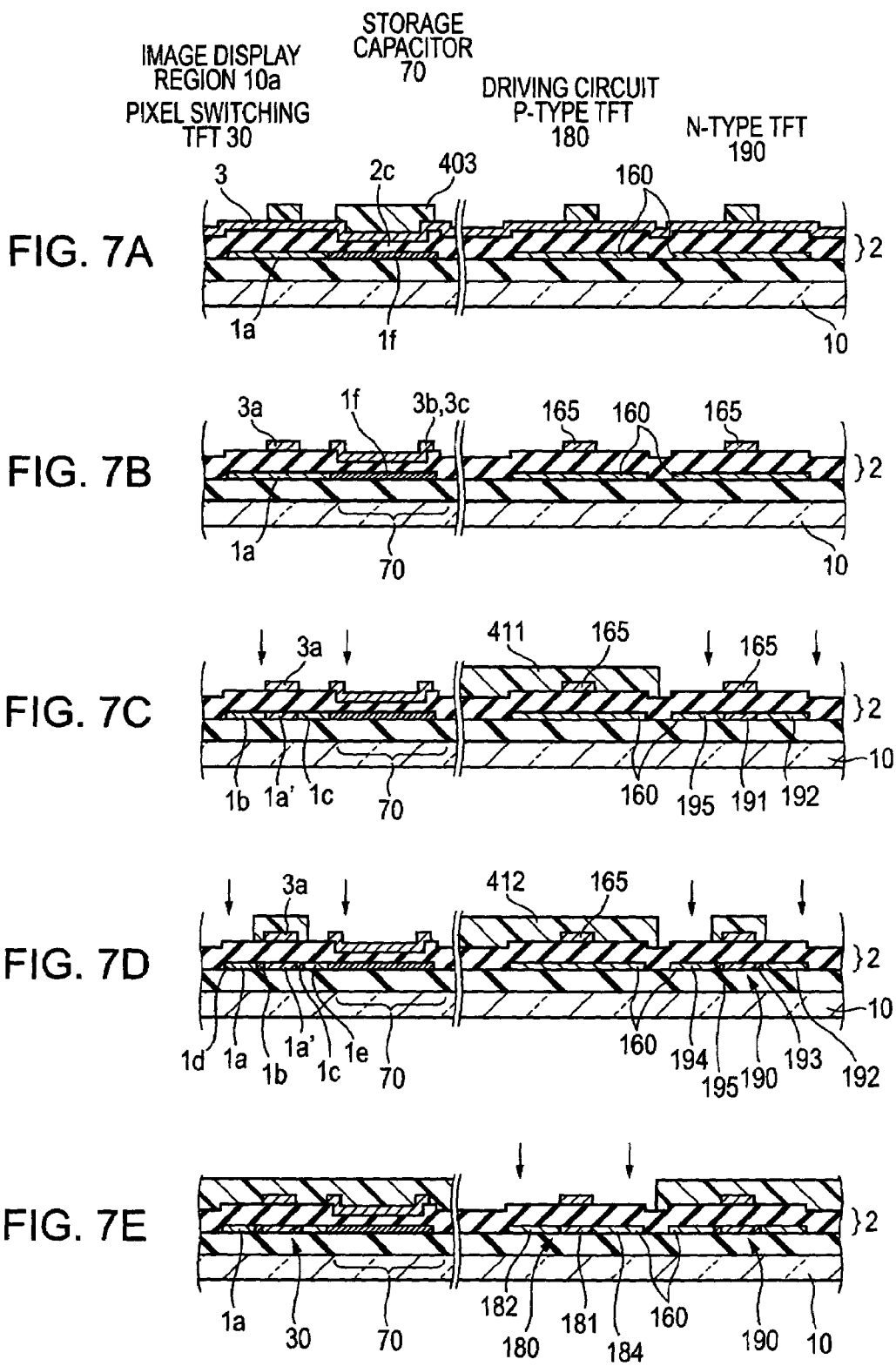

THIN-FILM SEMICONDUCTOR DEVICE, ELECTRO-OPTICAL DEVICE, AND ELECTRONIC APPARATUS

This application claims the benefit of Japanese Patent Application No. 2004-283652, filed Sep. 29, 2004. The entire disclosure of the prior application is hereby incorporated by reference herein in its entirety.

BACKGROUND

The present invention relates to a thin-film semiconductor device, in which a thin-film transistor and a capacitive element are provided on the same substrate, to an electro-optical device that uses such a thin-film semiconductor device as an electro-optical device substrate, and to an electronic apparatus having such an electro-optical device. More particularly, the present invention relates to a technology that can enhance the capacitance and breakdown voltage of a capacitive element.

When a thin-film transistor (hereinafter, referred to as a TFT) and a capacitive element are formed on the same substrate, a first electrode is formed using a semiconductor film formed on the same layer as an active layer of the TFT to be electrically conducted, a dielectric film is formed using an insulating film formed on the same layer as the gate insulating film, and a second electrode is formed using a conductive film formed on the same layer as the gate electrode. In this case, the TFT and the capacitive element can be formed with a small number of processes. This structure is widely used in an element substrate of a liquid crystal device (electro-optical device), in which the TFT is used as a nonlinear pixel-switching element, or in various thin-film semiconductor devices.

When the thickness of a dielectric film is small in the capacitive element, a large capacitance can be obtained. On the other hand, when the thickness of the gate insulating film is small in the TFT, the breakdown voltage may be reduced. Accordingly, a structure has been suggested in which, on the side of the capacitive element, the insulating film formed simultaneously with the gate insulating film is reduced in thickness so as to form the dielectric film (for example, see Japanese Unexamined Patent Application Publication No. 6-130413).

In the liquid crystal device, the area per pixel has significantly decreased as the demands for high-definition images have increased. For this reason, the liquid crystal capacitance gradually decreases, so that a capacitive element needs to have a large capacitance. However, when the dielectric film is reduced in thickness in the capacitive element in order to increase the capacitance, the breakdown voltage decreases, so that the yield or reliability of the liquid crystal device deteriorates.

The above-described problems can be solved by a method in which the dielectric film is reduced in thickness in the capacitive element in order to secure the breakdown voltage and an opposing area of first and second electrodes is expanded in order to increase the capacitance. However, in all semiconductor devices including the liquid crystal device, the expansion of an element formation area may be spatially restricted.

SUMMARY

An advantage of the invention is that it provides a thin-film semiconductor device that can secure a high breakdown voltage for a TFT and a capacitive element formed on the same substrate and that can increase the capacitance of the capacitive element, an electro-optical device that uses such a thin-film semiconductor device as an electro-optical device substrate, and an electronic apparatus having such an electro-optical device.

According to an aspect of the invention, a thin-film semiconductor device includes, on the same substrate, a thin-film transistor, in which an active layer, a gate insulating film, and a gate electrode are laminated, and a capacitive element, in which a first electrode formed using a semiconductor film formed on the same layer as the active layer to be electrically conducted, a dielectric film formed on the same layer as the gate insulating film, and a second electrode formed on the same layer as the gate electrode are laminated. In the capacitive element, in plan view, the dielectric film has a first region that is formed in a region inside outer circumferences of the first and second electrodes and that has a film thickness smaller than that of the gate insulating film, and a second region that is formed in a region outside the first region and that has a film thickness larger than that of the first region.

In the present specification, the same layer means a structure in which a part of the thin film or the entire thin film is formed on the same layer of the substrate.

Since the constituents of the TFT and the capacitive element are formed on the same layer, the TFT and the capacitive element can be formed with the small number of processes. Here, the dielectric film of the capacitive element is formed on the same layer as the gate insulating film of the TFT. In this case, the capacitance of the capacitive element can increase, without significantly decreasing the breakdown voltage of the TFT, even when the first region is formed to have the film thickness smaller than that of the gate insulating film. Since the dielectric film becomes the second region having the thickness smaller than that of the first region in the region at the outer circumferences of the first and second electrodes, the breakdown voltage is high. That is, the breakdown voltage of the capacitive element primarily tends to depend on the film thickness of the dielectric film at an end of the first electrode or the film thickness of the dielectric film at an end of the second electrode between the first electrode and the second electrode, and thus the film thickness of the dielectric film is selectively increased in such a portion. Therefore, in the capacitive element, the high breakdown voltage can be obtained, and a decrease in the capacitance caused by increasing the film thickness of the dielectric film in order to increase the breakdown voltage can be suppressed to the minimum. As a result, the high breakdown voltage can be secured for the TFT and the capacitive element formed on the same substrate, and the capacitance of the capacitive element can be increased.

In the thin-film semiconductor device according to the aspect of the invention, it is preferable that a film thickness of the dielectric film in the second region is substantially equal to that of the gate insulating film.

In the thin-film semiconductor device according to the aspect of the invention, it is preferable that, in the capacitive element, in plan view, the second electrode is formed in a region inside the first electrode, and the first region is formed in a region inside the second electrode. In addition, it is preferable that, in the capacitive element, in plan view, the first electrode is formed in a region inside the second electrode, and the first region is formed in a region inside the first electrode.

The thin-film semiconductor device according to the aspect of the invention can be used as an electro-optical device substrate, for example, in an electro-optical device. Here, an electro-optical material may be, for example, liquid crystal held between the substrate for an electro-optical device and a counter substrate disposed to face the substrate for an electro-optical device. The thin-film transistor and the capacitive element may be provided in each of a plurality of pixels disposed in a matrix shape. In addition, the electro-optical material may be an organic electroluminescent material provided on the substrate for an electro-optical device, and the thin-film transistor and the capacitive element may be provided in each of the plurality of pixels disposed in a matrix shape.

The electro-optical device can be used as a display unit of an electronic apparatus, such as a portable personal computer or a cellular phone.

BRIEF DESCRIPTION OF THE DRAWINGS

The invention will be described with reference to the accompanying drawings, wherein like numbers reference like elements, and wherein:

FIG. 7A is a cross-sectional view showing the manufacturing method of a TFT array substrate to which the invention is applied;

FIG. 7B is a cross-sectional view showing the manufacturing method of a TFT array substrate to which the invention is applied;

FIG. 7C is a cross-sectional view showing the manufacturing method of a TFT array substrate to which the invention is applied;

FIG. 7D is a cross-sectional view showing the manufacturing method of a TFT array substrate to which the invention is applied;

FIG. 7E is a cross-sectional view showing the manufacturing method of a TFT array substrate to which the invention is applied;

DETAILED DESCRIPTION OF EMBODIMENTS

Figure 1A:
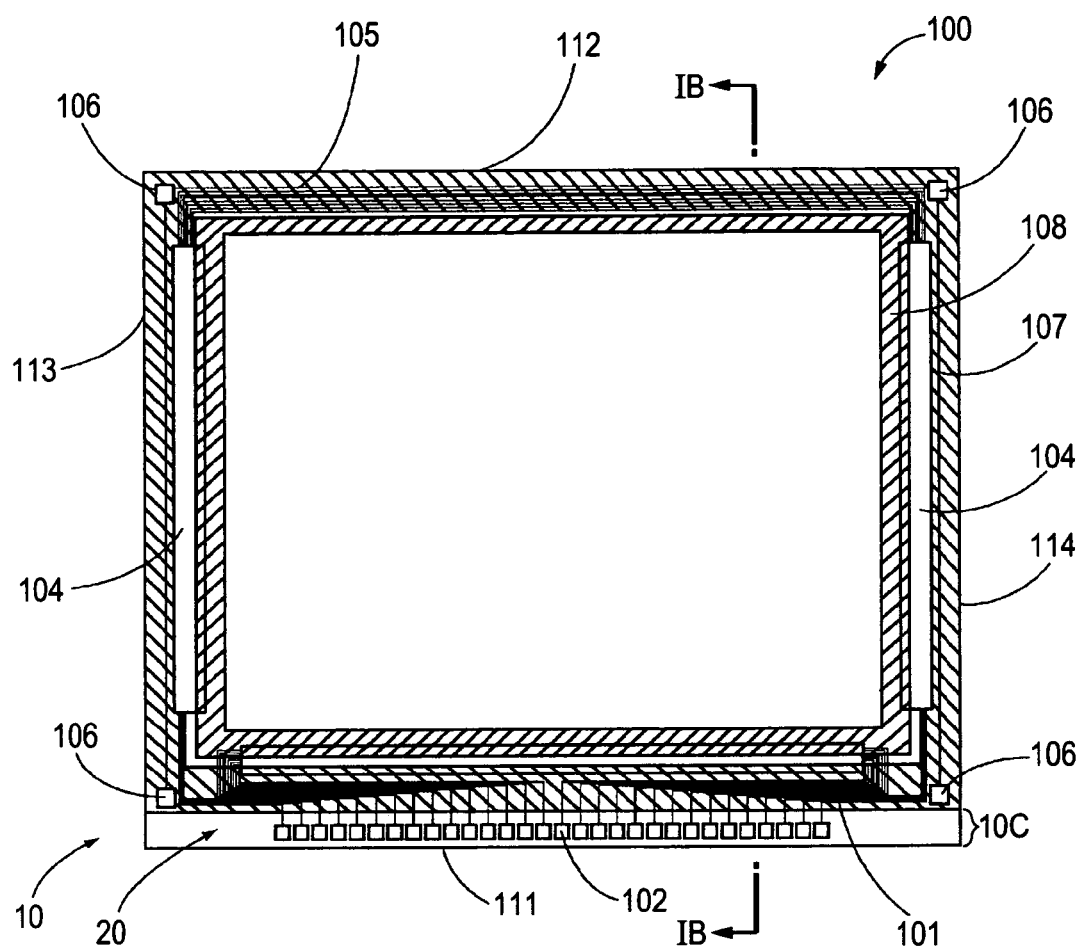
FIG. 1A is a plan view of a liquid crystal device according to a first embodiment of the invention, as viewed from a counter substrate, together with respective constituents formed thereon.

Hereinafter, an example will be described in which the invention is applied to a liquid crystal device, represented by an electro-optical device, with reference to the drawings. In addition, the scale of each layer or member has been adjusted in order to have a recognizable size in the drawings.

First Embodiment

[Overall Configuration of Liquid Crystal Device]

Figure 1B:
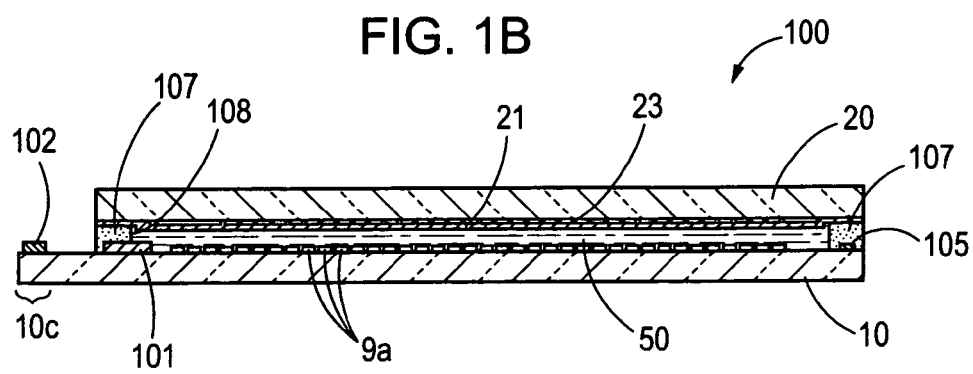
FIG. 1B is a cross-sectional view of the liquid crystal device, including the counter substrate, taken along the line IB-IB.

FIG. 1A is a plan view of a liquid crystal device according to a first embodiment of the invention, as viewed from a counter substrate, together with respective constituents formed thereon. FIG. 1B is a cross-sectional view of the liquid crystal device, including the counter substrate, taken along the line IB-IB.

In FIGS. 1A and 1B, a TFT array substrate 10 (thin-film semiconductor device) and a counter substrate 20 are bonded to each other by a sealing member 107 (a hatched region on a lower right side of FIG. 1A) that is coated along an edge of the counter substrate 20 in a liquid crystal device 100 (electro-optical device). Further, liquid crystal 50, which is an electro-optical material, is held between the TFT array substrate 10 and the counter substrate 20. A data line driving circuit 101 is formed at an outer circumference of the TFT array substrate 10 such that a portion of the data line driving circuit 101 overlaps the sealing member 107 on one substrate side 111, and scanning line driving circuits 104 are formed on two substrate sides 113 and 114. In the TFT array substrate 10, a plurality of terminals 102 are formed in a region 10c that protrudes from the counter substrate 20. In the TFT array substrate 10, a plurality of wiring lines 105, which serve to connect the scanning line driving circuits 104 provided on both sides of an image display region 10a, are formed on a substrate side 112 opposite to the substrate side 111. In addition, inter-substrate conductive members 106 are formed at four corner portions of the counter substrate 20 so as to electrically connect the TFT array substrate 10 to the counter substrate 20. In addition, each inter-substrate conductive member 106 is formed by mixing conductive particles, such as silver particles or gold-plated fibers, with epoxy resin-based adhesive components. Further, the sealing member 107 is an adhesive made of a photo-curable resin or a thermosetting resin, and is mixed with a gap material, such as glass fibers or glass beads, in order to maintain a gap between both substrates at a predetermined value.

In the TFT array substrate 10, a plurality of pixel electrodes 9a are disposed in a matrix shape, which will be described below in detail. In the counter substrate 20, a light-shielding film 108, which is made of a light-shielding material, is formed in a region inside the sealing member 107. Further, in the counter substrate 20, a light-shielding film 23, which is called a black matrix or a black stripe, is formed in regions opposite to vertical and horizontal boundary regions of the pixel electrodes 9a formed in the TFT array substrate 10. In addition, a counter electrode 21, which is made of an ITO film, is formed on the light-shielding film 23.

In a case in which the liquid crystal device 100 having the above-described configuration is used for a color display device of an electronic apparatus, such as a mobile computer, a cellular phone, and a liquid crystal television, or the like, RGB color filters (not shown) are formed in regions of the counter substrate 20 facing the pixel electrodes 9a.

[Configuration and Operation of Liquid Crystal Device 100]

Figure 2:
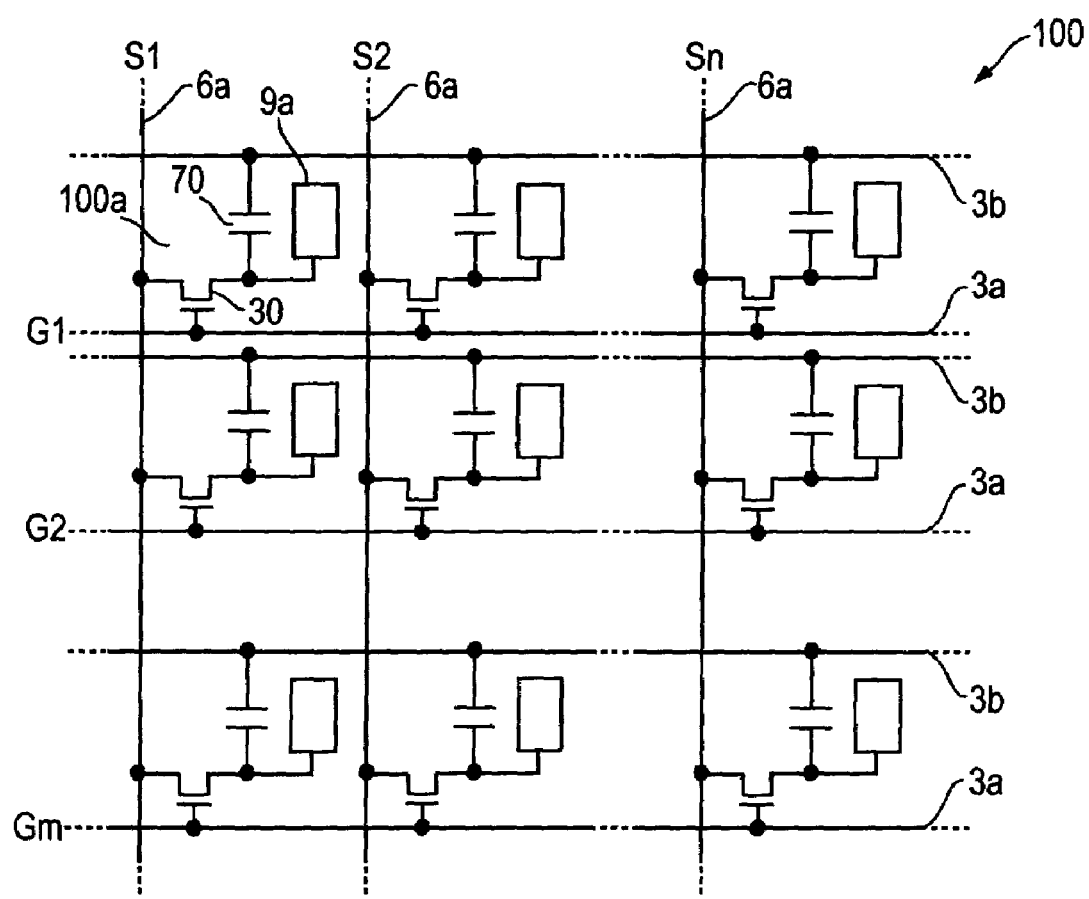
FIG. 2 is a block diagram showing an electrical configuration of the liquid crystal device.

FIG. 2 is a block diagram showing the electrical configuration of the liquid crystal device. As shown in FIG. 2, in the TFT array substrate 10 having a built-in driving circuit, a plurality of pixels 100a are arranged in a matrix shape so as to correspond to intersections of a plurality of data lines 6a and a plurality of scanning lines 3a. Each pixel 100a includes the pixel electrode 9a and a pixel switching TFT 30 that controls the pixel electrode 9a. The data line 6a that supplies a pixel signal is electrically connected to a source electrode of the TFT 30. Pixel signals S1, S2, . . . , and Sn written in the respective data lines 6a are line-sequentially supplied to the data lines 6a in that order. In addition, the scanning line 3a is electrically connected to a gate electrode of the TFT 30. At a predetermined timing, scanning signals G1, G2, . . . , and Gn are line-sequentially supplied to the scanning lines 3a in a pulse manner. The pixel electrode 9a is electrically connected to a drain electrode of the TFT 30, the TFT 30 serving as a switching element maintains an on state during a constant period, and the pixel signals S1, S2, . . . , and Sn supplied from the data lines 6a are written into the respective pixels at a predetermined timing. In such a manner, the pixel signals S1, S2, . . . , and Sn, each having a predetermined level, which are written into the liquid crystal via the pixel electrodes 9a, are held during a constant period between the pixel electrodes 9a and a counter electrode 21 of the counter substrate 20 shown in FIG. 1B.

Here, in the TFT array substrate 10, in order to prevent leakage of the held pixel signal, a storage capacitor 70 (capacitive element) is additionally provided in parallel with a liquid crystal capacitor formed between the pixel electrode 9a and the counter electrode 21. For example, the voltage of the pixel electrode 9a is held by the storage capacitor 70 for a longer time, namely, for a period as much as three orders of magnitude longer than the time for which the source voltage is applied. Accordingly, the maintenance characteristic is enhanced, such that display having a high contrast ratio can be realized. In addition, the storage capacitor 70 may be formed by a capacitor line 3b, like the present embodiment, but may be formed by a pre-stage scanning line 3a.

[Configuration of TFT Array Substrate]

Figure 3:
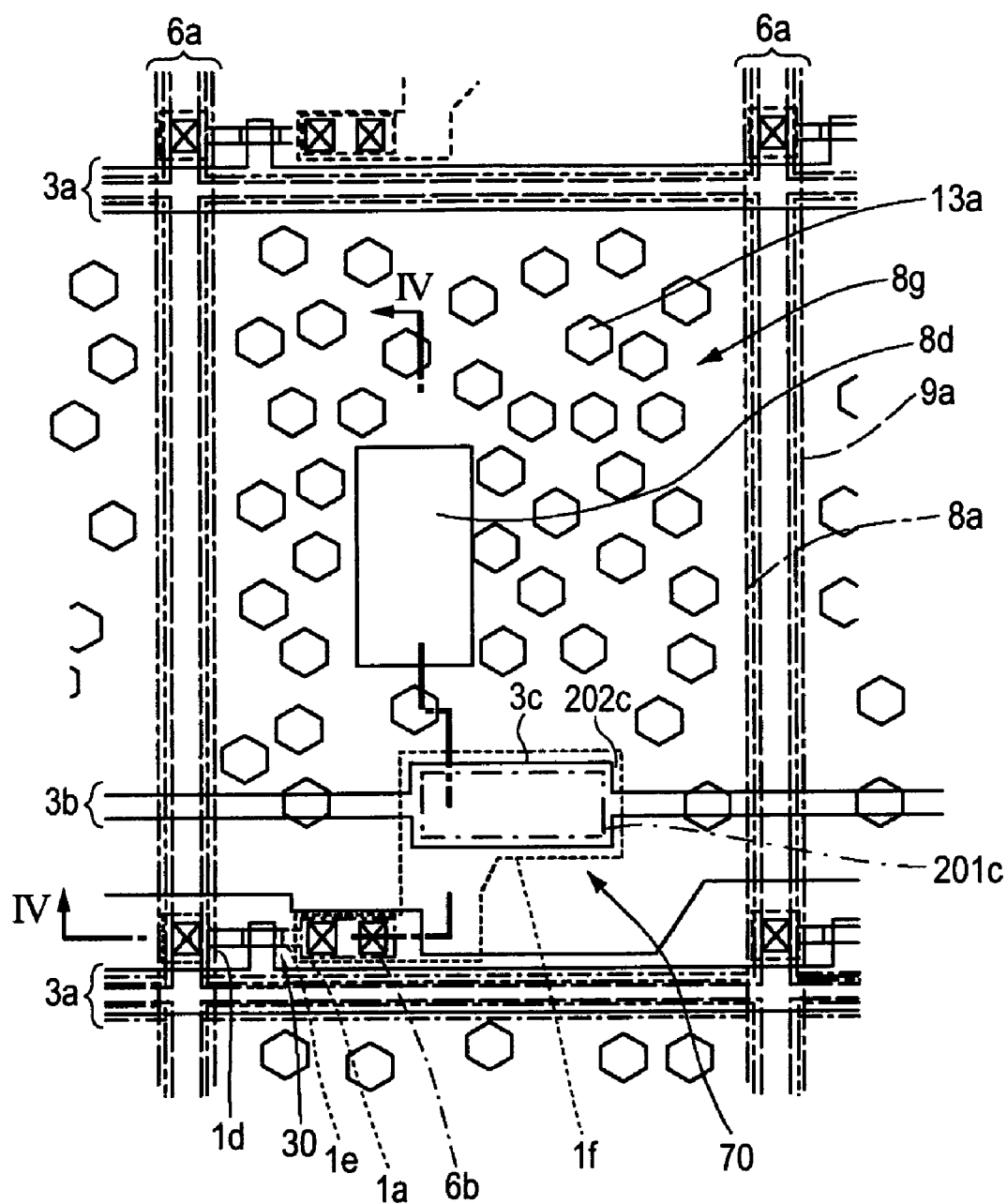
FIG. 3 is a plan view of adjacent pixels in a TFT array substrate of the liquid crystal device shown in FIG. 1.
Figure 4:
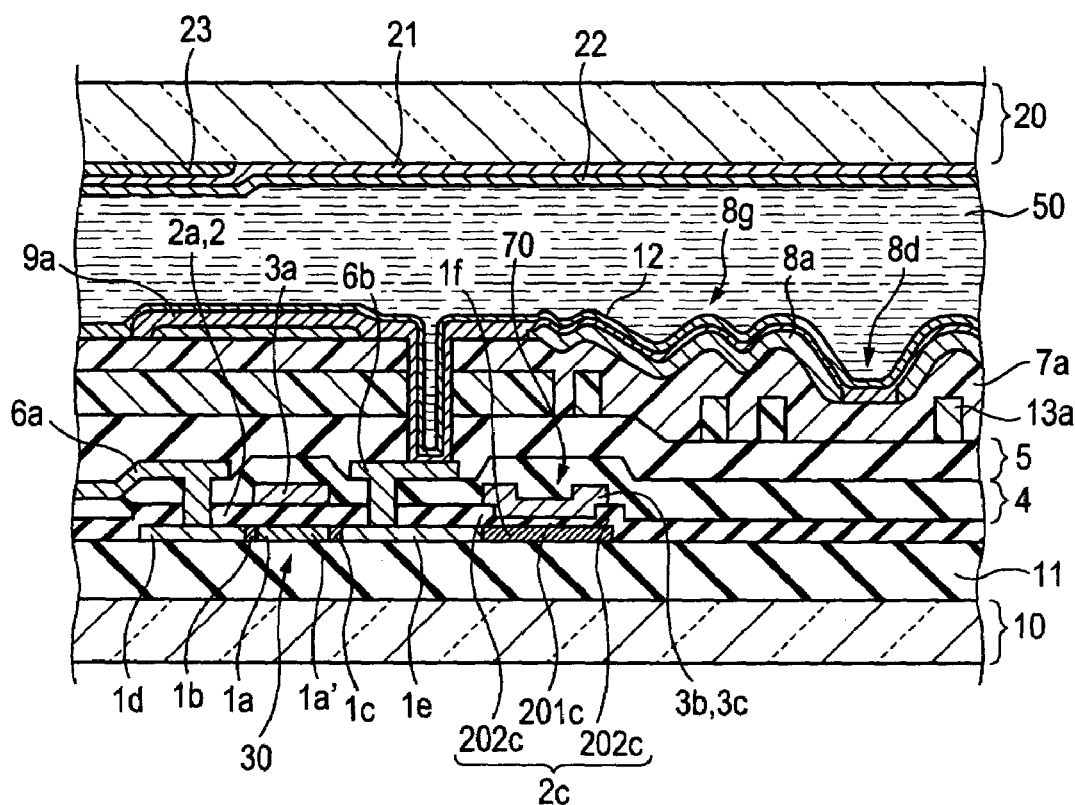
FIG. 4 is a cross-sectional view taken along the line IV-IV of FIG. 3.

FIG. 3 is a plan view of adjacent pixels in a TFT array substrate. FIG. 4 is a cross-sectional view taken along the line IV-IV of FIG. 3.

As shown in FIG. 3, on the TFT array substrate 10, the plurality of pixel electrodes 9a, which are made of a plurality of ITO (Indium Tin Oxide) films, are arranged in a matrix shape, and the pixel switching TFTs 30 are connected to the pixel electrodes 9a, respectively. In addition, the data lines 6a, the scanning lines 3a, and the capacitor lines 3b are formed along vertical and horizontal boundaries of the pixel electrodes 9a. Each of the TFTs 30 is connected to a corresponding data line 6a and scanning line 3a. That is, the data line 6a is electrically connected to a heavily-doped source region 1d of the TFT 30 via a contact hole, and the scanning line 3a has protruded portions, each constituting the gate electrode of each of the TFTs 30. The storage capacitor 70 has a first electrode 1f (lower electrode) that is electrically connected to an extended portion of a semiconductor film 1a in order to form the pixel switching TFT 30, and a second electrode 3c (upper electrode) that is a rectangular portion of the capacitor line 3b overlapping the first electrode 1f.

As shown in FIG. 4, in the TFT array substrate 10, a transparent substrate 10b is used as a base substrate. In addition, a base protective film 11, which is made of a silicon oxide film (insulating film) having a thickness of 300 to 500 nm, is formed on a surface of the transparent substrate 10b, and a semiconductor film 1a, which has a thickness of 30 to 100 nm and an island shape, is formed on a surface of the base protective film 11. In addition, a gate insulating film 2a, which is made of an insulating film 2, such as a silicon oxide film having a thickness of 50 to 150 nm, is formed on a surface of the semiconductor film 1a, and the scanning line 3a, which has a thickness of 300 to 800 nm, formed on a surface of the gate insulating film 2a. A region of the semiconductor film 1a facing the scanning line 3a with the gate insulating film 2a therebetween becomes a channel region 1a' (active layer). On one side of the channel region 1a', a source region that has a lightly-doped source region 1b and a heavily-doped source region 1d is formed, and, on the other side of the channel region 1a', a drain region that has a lightly-doped drain region 1c and a heavily-doped drain region 1e is formed.

Further, an interlayer insulating film 4, which is made of a silicon oxide film having a thickness of 300 to 800 nm, is formed on a surface of the pixel switching TFT 30, and an interlayer insulating film 5, which is made of a silicon nitride film having a thickness of 100 to 300 nm, is formed on a surface of the interlayer insulating film 4. The data line 6a having a thickness of 300 to 800 nm is formed on the surface of the interlayer insulating film 4, and the data line 6a is electrically connected to the heavily-doped source region 1d via a contact hole formed in the interlayer insulating film 4. The drain electrode 6b is formed on the surface of the interlayer insulating film 4 simultaneously with the data line 6a. The drain electrode 6b is electrically connected to the heavily-doped drain region 1e via a contact hole formed in the interlayer insulating film 4.

On the interlayer insulating film 5, a concavo-convex forming layer 13a, which is made of a translucent photosensitive resin, is formed in a predetermined pattern. An upper insulating film 7a, which is made of a translucent photosensitive resin, is formed on a surface of the concavo-convex forming layer 13a, and a light-reflecting film 8a, made of an aluminum film, that can perform image display in a reflective mode, is formed on the surface of the upper insulating film 7a. On a surface of the light-reflecting film 8a, a concavo-convex pattern 8g is formed in which a concavo-convex shape of the concavo-convex forming layer 13a is reflected, and the concavo-convex pattern 8g has a smooth shape with no edge. Further, the pixel electrode 9a is formed on the light-reflecting film 8a, but may be directly laminated on the surface of the light-reflecting film 8a. In addition, the pixel electrode 9a is electrically connected to the drain electrode 6b via contact holes formed in the upper insulating film 7a, the concavo-convex forming layer 13a, and the interlayer insulating film 5. An alignment film 12 made of a polyimide film is formed on the surface of the pixel electrode 9a. The alignment film 12 is made of a polyimide film on which a rubbing treatment is performed. In FIG. 3, the shape of the concavo-convex forming layer 13a is hexagonal in plan view, but it may have various shapes, such as a circular shape, an octagonal shape, or the like.

In the light-reflecting film 8a, a rectangular light-transmitting window 8d, which can perform image display in a transmissive mode, is formed in a portion of a region two-dimensionally overlapping the pixel electrode 9a. At a portion corresponding to the light-transmitting window 8d, the pixel electrode 9a made of the ITO film exists, while the light-reflecting film 8a does not exist.

The second electrode 3c, which is the rectangular portion of the capacitor line 3b, faces the extended portion (the first electrode 1f) from the heavily-doped drain region 1e via an insulating film (the dielectric film 2c) formed simultaneously with the gate insulating film 2a, thereby forming the storage capacitor 70.

In addition, it is preferable for the TFT 30 to have an LDD (Lightly Doped Drain) structure, as described above, but the TFT 30 may have an offset structure in which impurity ions are not implanted in the regions corresponding to the lightly-doped source region 1b and the lightly-doped drain region 1c. In addition, the TFT 30 may be a self-alignment-type TFT in which the impurity ions are implanted with high concentration using the gate electrode (a portion of the scanning line 3a) as a mask, and the heavily-doped source region and the heavily-doped drain region are formed in a self-aligned manner.

According to the present embodiment, the TFT 30 has the single gate structure in which one gate electrode is disposed between the source region and the drain region, but it may have two or more gate electrodes disposed between the source region and the drain region. At this time, the same signal applies to the respective gate electrodes. As such, when the TFT 30 has dual gates (double gates), or triple gates or more, current leakage in a junction portion between the channel region and the source/drain region can be prevented and thus an off current can be reduced. When one of the gate electrodes has the LDD structure or offset structure, the off current can be further reduced, so that a stable switching element can be obtained.

[Detailed Configuration of Storage Capacitor 70]

As shown in FIGS. 3 and 4, when the TFT array substrate 10 and the storage capacitor 70 are viewed two-dimensionally, the dielectric film 2c has a first region 201c and a second region 202c. Specifically, the first region 201c has a film thickness smaller than that of the gate insulting film 2a and is formed in a region inside outer circumferences of the first electrode 1f and the second electrode 3c. Further, the second region 202c has a film thickness larger than that of the first region 201c and is formed in a region outside the first region 1c. In the present embodiment, since the second electrode 3c has an area smaller than that of the first electrode 1f and is formed in a region inside the first electrode 1f, the first region 201c is formed in a region inside the second electrode 3c. In addition, the second region 202c of the dielectric film 2c has the same film thickness as the gate insulating film 2a.

In the TFT array substrate 10 having the above-described configuration, the constituents of the TFT 30 and the storage capacitor 70 are formed on the same layer, and thus the TFT 30 and the storage capacitor 70 can be manufactured with a small number of processes, which will be described below. Here, the dielectric film 2c of the storage capacitor 70 is formed on the same layer as the gate insulating film 2a of the TFT 30. In this case, the first region 201c, which has a film thickness smaller than that of the gate insulating film 2a, is formed in the dielectric film 2c, so that the capacitance of the storage capacitor 70 can be increased.

In addition, the second region 202c, which has a film thickness smaller than that of the first region 201c, is formed in the dielectric film 2c, so that the breakdown voltage of the storage capacitor 70 is high. That is, the breakdown voltage of the storage capacitor 70 primarily tends to depend on the film thickness of the dielectric film 2c at an end of the first electrode 1f or the film thickness of the dielectric film 2c at an end of the second electrode 3c between the first electrode 1f and the second electrode 3c, so that, in the present embodiment, the film thickness of the dielectric film 2c is selectively increased in such a portion. Therefore, in the storage capacitor 70, a high breakdown voltage can be obtained, and a decrease in the capacitance caused by increasing the film thickness of the dielectric film 2c in order to increase the breakdown voltage can be suppressed to the minimum. As a result, a high breakdown voltage can be secured for the TFT 30 and the storage capacitor 70 formed on the same substrate, and the capacitance of the storage capacitor 70 can be increased.

[Configuration of Counter Substrate 20]

In the counter substrate 20, a light-shielding film 23, which is called a black matrix or a black stripe, is formed on regions facing regions of vertical and horizontal boundaries of the pixel electrodes 9a formed in the TFT array substrate 10, and the counter electrode 21 made of the ITO film is formed on the light-shielding film 23. In addition, the alignment film 22 made of the polyimide film is formed on the counter electrode 21, and the alignment film 22 is made of the polyimide film on which the rubbing treatment is performed.

[Configuration of Driving Circuit]

Returning to FIG. 1A, peripheral circuits, such as the data line driving circuit 101, the scanning line driving circuits 104, or the like, are formed in a peripheral region of the image display region 10a on the surface of the TFT array substrate 10, in the liquid crystal device 100 according to the present embodiment. The data line driving circuit 101 and the scanning line driving circuit 104 basically has an N-channel TFT or a P-channel TFT shown in FIG. 5.

Figure 5:
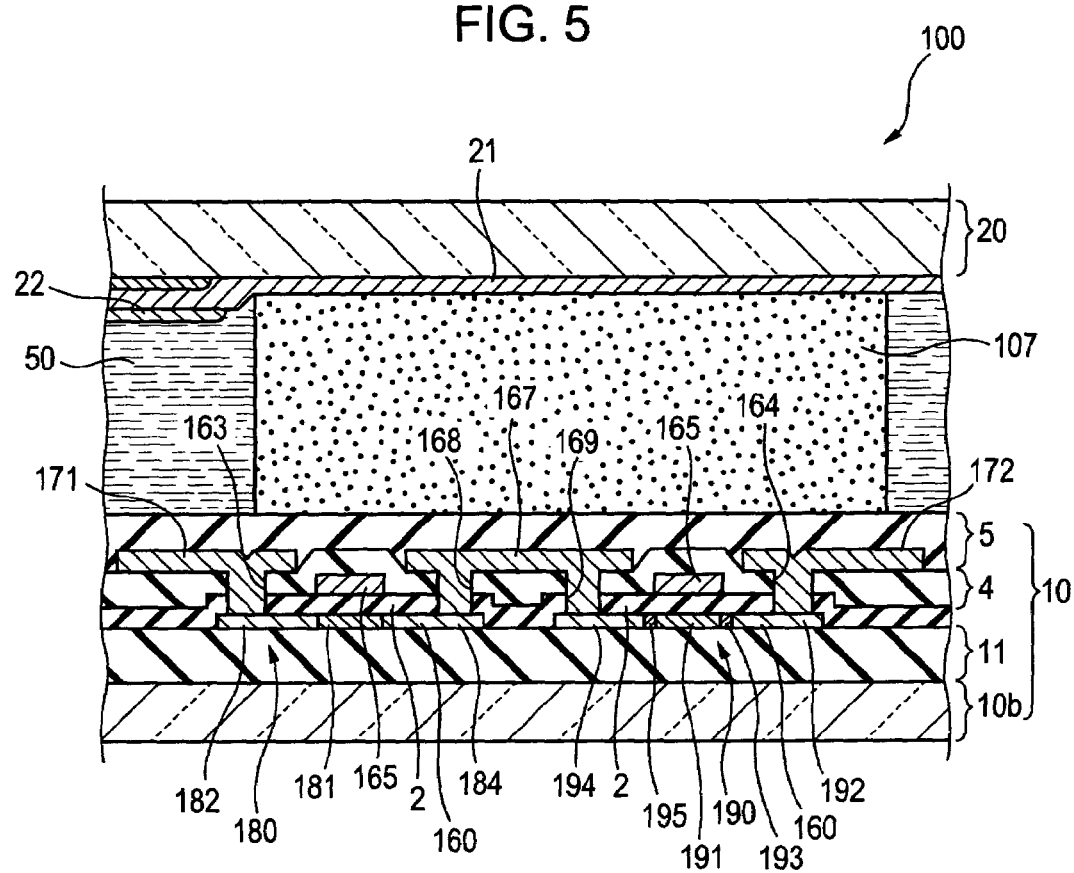
FIG. 5 is a cross-sectional view showing a configuration of a TFT constituting a peripheral circuit in the liquid crystal device shown in FIG. 1.

FIG. 5 is a cross-sectional view showing the configuration of a TFT constituting a peripheral circuit, such as the scanning line driving circuit 104 or the data line driving circuit 101. In FIG. 5, the TFT constituting the peripheral circuit has a complementary TFT including a P-channel TFT 180 and an N-channel TFT 190. A semiconductor film 160 constituting TFTs 180 and 190 for a driving circuit is formed on a surface of the base protective film 11 of the transparent substrate 10b to have an island shape. In the TFTs 180 and 190, a high-potential line 171 and a low-potential line 172 are electrically connected to the source region of the semiconductor film 160 via contact holes 163 and 164. In addition, input wiring lines 166 are connected to common gate electrode 165, and output wiring lines 167 are electrically connected to the drain region of the semiconductor film 160 via contact holes 168 and 169.

Since the peripheral circuit region is formed through the same process as the image display region 10a, the interlayer insulating films 4 and 5 and the insulating film 2 (the gate insulating film) are also formed in the peripheral circuit region. In addition, the N-channel TFT 190 for a driving circuit also has the LDD structure, like the pixel switching TFT 30, and, on both sides of a channel formation region 191, a source region having a heavily-doped source region 192 and a lightly-doped source region 193 and a drain region having of a heavily-doped drain region 194 and a lightly-doped drain region 195 are provided. In addition, the P-channel TFT 180 for a driving circuit may have the LDD structure, like the N-channel TFT 190. However, in the present embodiment, the P-channel TFT 180 has the self alignment structure, and, on both sides of the channel formation region 181, a heavily-doped source region 182 and a heavily-doped drain region 184 are provided.

[Manufacturing Method of TFT Array Substrate]

FIGS. 6A to 7E are cross-sectional views showing a manufacturing method of the TFT array substrate 10 according to the present embodiment. In addition, FIGS. 6A to 7E correspond to FIGS. 4 and 5.

Figure 6A:
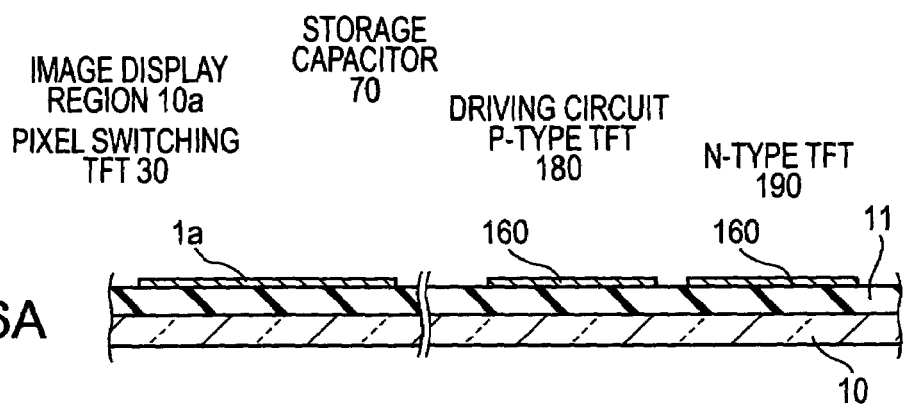
FIG. 6A is a cross-sectional view showing a manufacturing method of a TFT array substrate to which the invention is applied.

As shown in FIG. 6A, the transparent substrate 10 made of glass is prepared while being cleaned by ultrasonic cleaning or the like, the base protective film 11 is formed on the transparent substrate 10, and semiconductor films 1a and 160 are formed on the base protective film 11. When the semiconductor films 1a and 160 are formed, a semiconductor film made of an amorphous silicon film is formed on the surface of the base protective film 11 by means of a plasma CVD (Chemical Vapor Deposition) method to have a thickness of 30 to 100 nm under a condition that the substrate temperature is 150 to 450° C. Next, a laser beam is irradiated onto the semiconductor film to perform laser annealing, and then the semiconductor film is patterned using a photolithography technology.

Figure 6B:
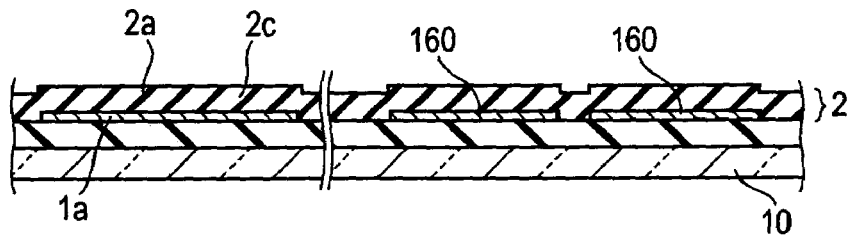
FIG. 6B is a cross-sectional view showing the manufacturing method of a TFT array substrate to which the invention is applied.

Next, as shown in FIG. 6B, the insulating film 2 (the gate insulating film 2a and the dielectric film 2c), such as a silicon oxide film or the like, having a thickness of 50 to 150 nm, is formed on the entire surface of the transparent substrate 10 under a condition that the substrate temperature is not more than 350° C. At this time, for example, a mixed gas of TEOS (tetraethyl orthosilicate) and an oxygen gas can be used as a raw gas. The insulating film 2a formed through the present process may be made of a silicon nitride film, instead of the silicon oxide film.

Figure 6C:
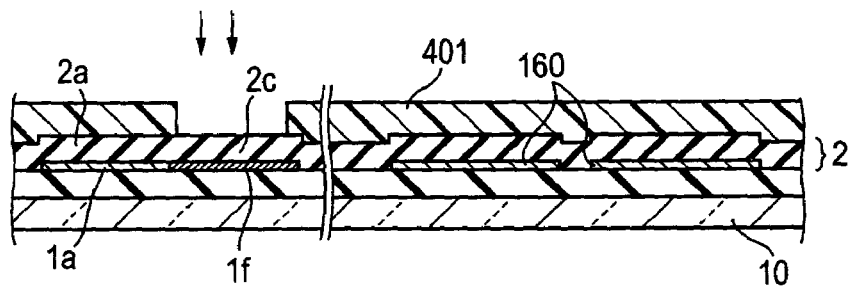
FIG. 6C is a cross-sectional view showing the manufacturing method of a TFT array substrate to which the invention is applied.

Next, as shown in FIG. 6C, a resist mask 401 is formed on the surface of the insulating film 2, and N-type impurity ions (phosphorus ions) of a low concentration are implanted into the extended portion of the semiconductor film 1a through the resist mask 401 with a dose of about $0.1 \times 10^{13}$/cm² to about $10 \times 10^{13}$/cm², thereby forming the first electrode 1f for constituting the storage capacitor 70. At this time, the N-type impurity ions of a high concentration may be implanted, thereby forming the first electrode 1f.

Figure 6D:
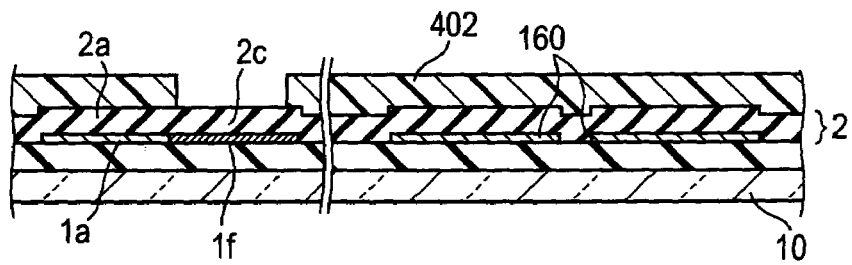
FIG. 6D is a cross-sectional view showing the manufacturing method of a TFT array substrate to which the invention is applied.
Figure 6E:
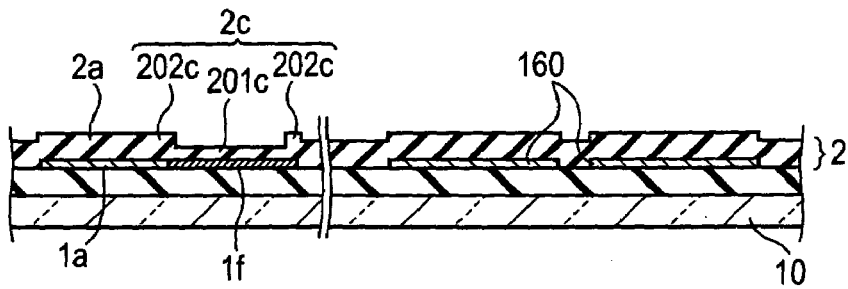
FIG. 6E is a cross-sectional view showing the manufacturing method of a TFT array substrate to which the invention is applied.

Next, as shown in FIG. 6D, after the resist mask 401 is formed in order to form the first region 201c of the dielectric film 2c described with reference to FIGS. 3 and 4, a portion of the dielectric film 2c is etched through the resist mask 401 in order to reduce the thickness, thereby forming the first region 201c in the dielectric film 2c, as shown in FIG. 6E. At this time, a portion of the dielectric film 2c covered with the resist mask 402, without etching, becomes the second region 202c. In addition, the process shown in FIG. 6C and the processes shown in FIGS. 6D and 6E may be changed.

Next, as shown in FIG. 7A, a conductive film 3, made of a metal film, such as aluminum, tantalum, molybdenum, or the like, or an alloy film primarily containing one of these metals, is formed on the entire surface of the transparent substrate 10 to have a thickness of 300 to 800 nm, a resist mask 403 is then formed thereon using a photography technology, and the conductive film 3 is dry-etched via the resist mask 403. As a result, as shown in FIG. 7B, the scanning line 3a, the gate electrode 165, and the capacitor line 3b (the second electrode 3c of the storage capacitor 70) are formed.

Next, as shown in FIG. 7C, in a state in which the semiconductor film 160 is covered with a resist mask 411 for forming the P-channel TFT 180, the N-type impurity ions (phosphorus ions) of a low concentration are implanted into the semiconductor film 1a constituting the pixel switching TFT 30 and the semiconductor film 160 constituting the N-channel TFT 190 for a driving circuit using the scanning line 3a or the gate electrode 165 as a mask with a dose of about $0.1 \times 10^{13}$/cm² to about $10 \times 10^{13}$/cm², thereby forming the lightly-doped source regions 1b and 193 and the lightly-doped drain regions 1c and 195 in a self alignment manner with respect to the scanning line 3a and the gate electrode 165. Here, portions that are disposed just below the scanning line 3a or the gate electrode 165 and into which the impurity ions are not implanted become the channel regions 1a' and 191 of the semiconductor films 1a and 160.

Next, as shown in FIG. 7D, a resist mask 412 is formed to have a width larger than that of the scanning line 3a and the gate electrode 165 and to cover the semiconductor film 160 for forming the P-channel TFT 180. In this state, the N-type impurity ions (phosphorus ions) of a high concentration are implanted with a dose of about $0.1 \times 10^{15}$/cm² to about $10 \times 10^{15}$/cm², thereby forming the heavily-doped source regions 1d and 192 and the heavily-doped drain regions 1e and 194.

Next, as shown in FIG. 7E, in a state in which the semiconductor films 1a and 160 are covered with the resist mask 413 for forming the N-channel TFTs 30 and 190, the P-type impurity ions (boron ions) are implanted into the semiconductor film 160 constituting the P-channel TFT 180 for a driving circuit using the gate electrode 165 as a mask with a dose of about $0.1 \times 10^{15}$/cm² to about $10 \times 10^{15}$/cm², thereby forming the heavily-doped source region 182 and the heavily-doped drain region 184.

Hereinafter, as shown in FIGS. 4 and 5, the interlayer insulating film 4 made of the silicon oxide film is formed on the entire surface of the transparent substrate 10b, contact holes 163, 164, 168, and 169 are formed in the interlayer insulating film 4, and the data line 6a and the drain electrode 6b, such as the aluminum film, the tantalum film, the molybdenum film or the like, are formed with the plurality of processes. As a result, the TFT array substrate 10 having the configuration shown in FIGS. 4 and 5 is formed. The known processes can be used for such processes, and thus the descriptions thereof will be omitted.

Second Embodiment

Figure 8:
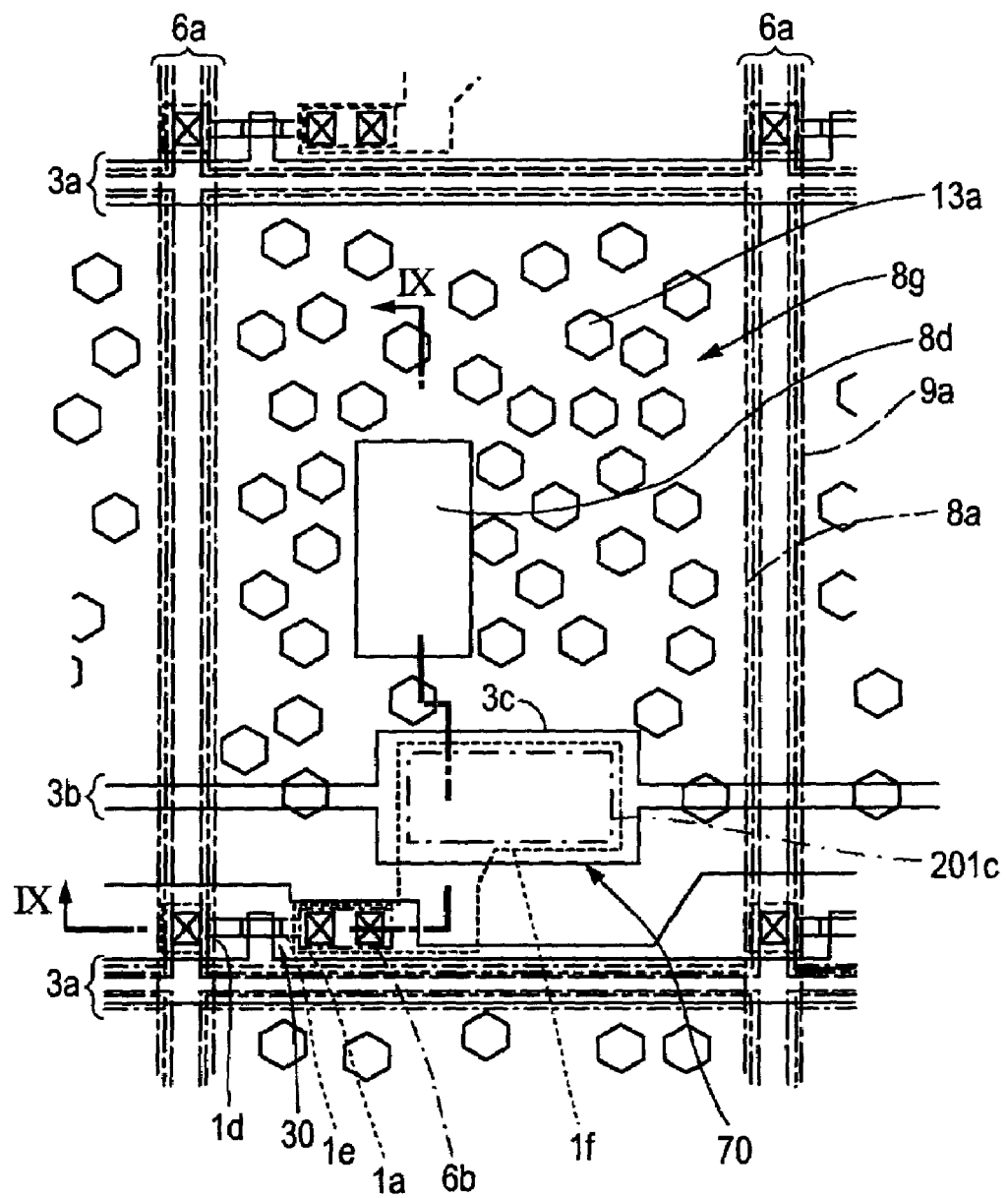
FIG. 8 is a plan view of adjacent pixels in a TFT array substrate of a liquid crystal device according to a second embodiment of the invention.
Figure 9:
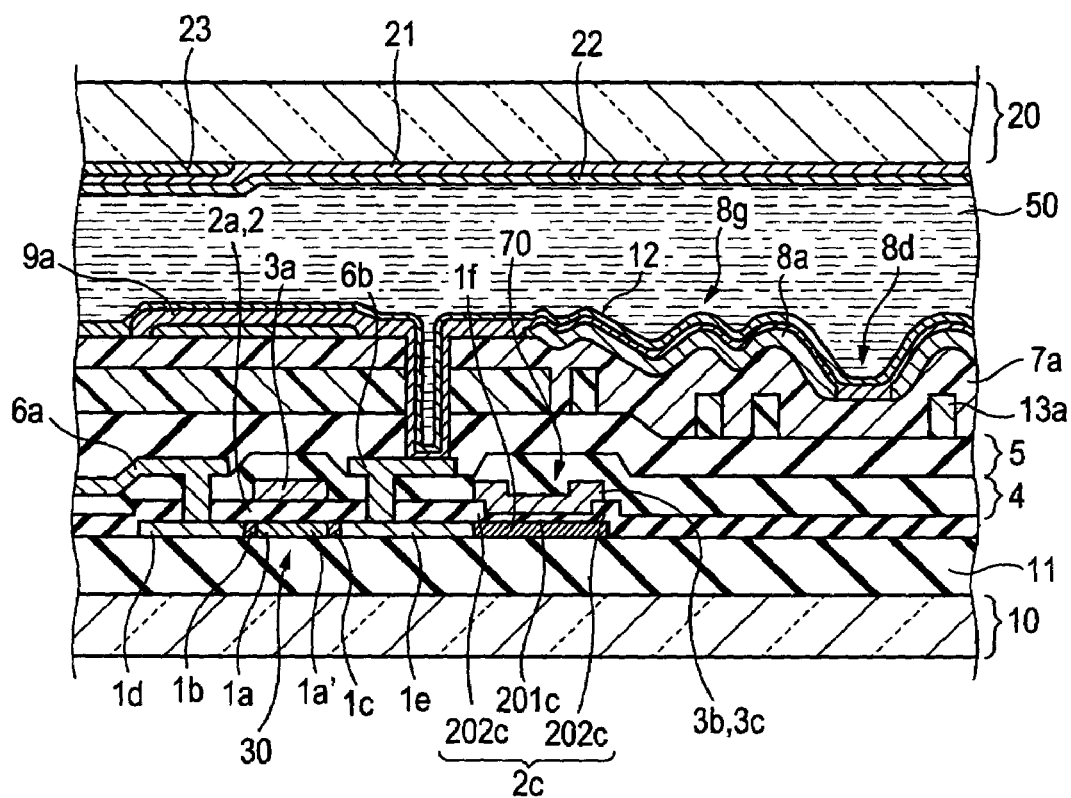
FIG. 9 is a cross-sectional view of the TFT array substrate of FIG. 8.

FIG. 8 is a plan view of adjacent pixels in a TFT array substrate of an electro-optical device according to a second embodiment of the invention. FIG. 9 is a cross-sectional view taken along the line IV-IV of FIG. 3 or FIG. 8. In addition, since the electro-optical device according to the present embodiment has the same basic configuration as the first embodiment, the same parts as those in the first embodiment are represented by the same reference numerals, and thus the descriptions thereof will be omitted.

As shown in FIGS. 8 and 9, according to the second embodiment, when a TFT array substrate 10 and a storage capacitor 70 are viewed two-dimensionally, a dielectric film 2c has a first region 201c and a second region 202c. Specifically, the first region 201c has a thickness smaller than that of the gate insulting film 2a and is formed in a region inside the outer circumferences of the first electrode 1f and the second electrode 3c. Further, the second region 202c has a film thickness larger than that of the first region 201c and is formed in a region overlapping the outer circumference of the first electrode 1f and the second electrode 3c. In the present embodiment, unlike the first embodiment, the first electrode 1f has an area smaller than that of the second electrode 3c and is formed in a region inside the second electrode 3c, so that the first region 201c is formed in a region inside the first electrode 1f. In addition, the second region 202c of the dielectric film 2c has the substantially same film thickness as the gate insulating film 2a.

In the TFT array substrate 10 having the above-described configuration, the dielectric film 2c of the storage capacitor 70 is formed on the same layer as the gate insulating film 2a of the TFT 30. However, the first region 201c, which has a thickness smaller than that of the gate insulating film 2a, is formed in the dielectric film 2c, so that a capacitance of the storage capacitor 70 can be increased. In addition, the dielectric film 2c becomes the second region 202c having a thickness larger than that of the first region 201c in a region where the dielectric film 2c overlaps the outer circumference of the first electrode 1f and the second electrode 3c, the breakdown voltage of the storage capacitor 70 is high. Therefore, in the storage capacitor 70, the high breakdown voltage can be obtained, and the decrease of the capacitance caused by increasing the thickness of the dielectric film 2c in order to increase the breakdown voltage can be suppressed to the minimum. As a result, the high breakdown voltage can be secured for the TFT 30 and the storage capacitor 70 formed on the same substrate, and the capacitance of the storage capacitor 70 can increased.

OTHER EMBODIMENTS

According to the first and second embodiments, the insulating film 2 constituting the gate insulating film 2a and the dielectric film 2c has the single layer structure, but a laminated film having a silicon oxide film and a silicon nitride film may be used. In this case, one of two insulating films may be removed in a portion of the dielectric film 2c, so that a first region 201c having a small thickness may be formed.

In addition, according to the first and second embodiments, the thin-film semiconductor device having the top gate-type TFT is exemplified, but a thin-film semiconductor device having a bottom gate-type TFT may be applied to the invention.

Further, the invention may be applied to an electro-optical device, such as an organic EL display device, an electrophoretic display device, or the like, which is described below, in addition to the substrate for an electro-optical device of the liquid crystal device as the thin-film semiconductor device.

Figure 10:
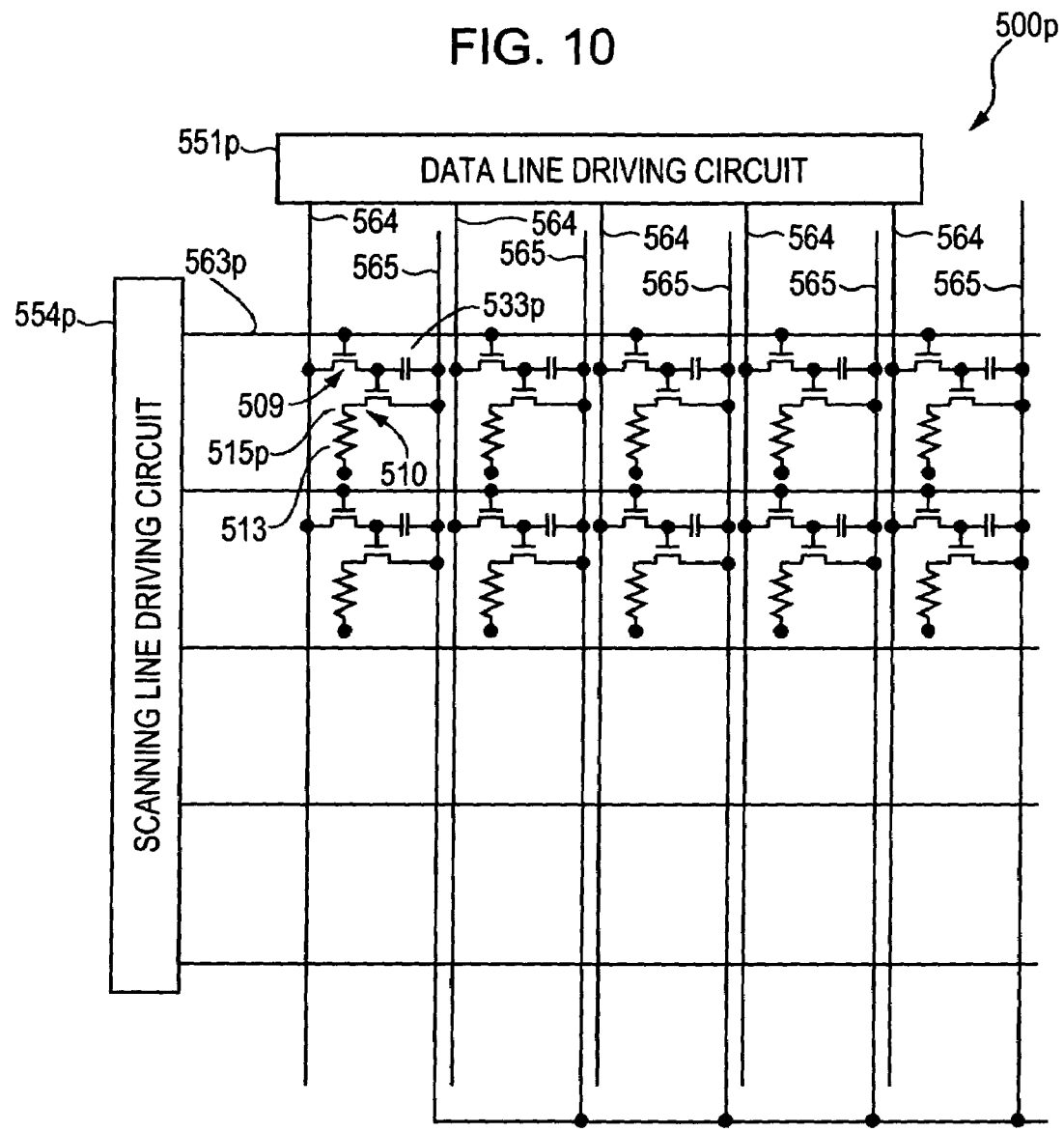
FIG. 10 is a block diagram showing an electrical configuration of an organic EL display device.

An organic EL display device 500p shown in FIG. 10 is a display device in which driving of an EL element is controlled by the TFT and the EL element emits light by causing a driving current to flow in an organic semiconductor film. Since a light-emitting element used in such a display device is a self-emitting type, the backlight is not required, and dependency of a viewing angle is small. The electro-optical device 500p shown in FIG. 10 includes a plurality of scanning lines 563p, a plurality of data lines 564 disposed so as to intersect the plurality of scanning lines 563p, a plurality of common feed lines 505 disposed in parallel with the plurality of data lines 564, and a plurality of pixels 515p provided to correspond to intersections of the data lines 564 and the scanning lines 563p. The plurality of pixels 515p are arranged in a matrix shape in the image display region 100. As for the data lines 564, a data line driving circuit 551p has a shift register, a level shifter, a video line, and an analog switch. As for the scanning lines 563p, a scanning line driving circuit 554p has a shift register and a level shifter. In addition, each pixel 515p includes a switching TFT 509 a gate electrode of which is supplied with a scanning signal via the scanning line 563p, a storage capacitor 533p that holds an image signal supplied from the data line 564 via the switching TFT 509, a current TFT 510 a gate electrode of which is supplied with the image signal held by the storage capacitor 533p, and a light-emitting element 513 in which the driving current flows from the common feed line 565 when being electrically connected to the common feed line 565 via the current TFT 510. The light-emitting element 513 has the configuration in which a hole-injecting layer, an organic semiconductor film serving as an organic EL material layer, and a counter substrate made of a metal film, such as aluminum containing lithium, a calcium or the like, are laminated on the pixel electrode. The counter electrode is formed over the plurality of pixels 515p while crossing over the data lines 564.

The organic EL display device 500p having the above-described configuration is a thin-film semiconductor device in which the TFT and the capacitive element are formed on the same substrate, so that the invention may be applied thereto.

[Application of Liquid Crystal Device to Electronic Apparatus]

An electro-optical device, such as the liquid crystal device 100, to which the invention is applied, can be used as display units of various electronic apparatuses. Examples thereof will be described with reference to FIGS. 11A and 11B.

Figure 11A:
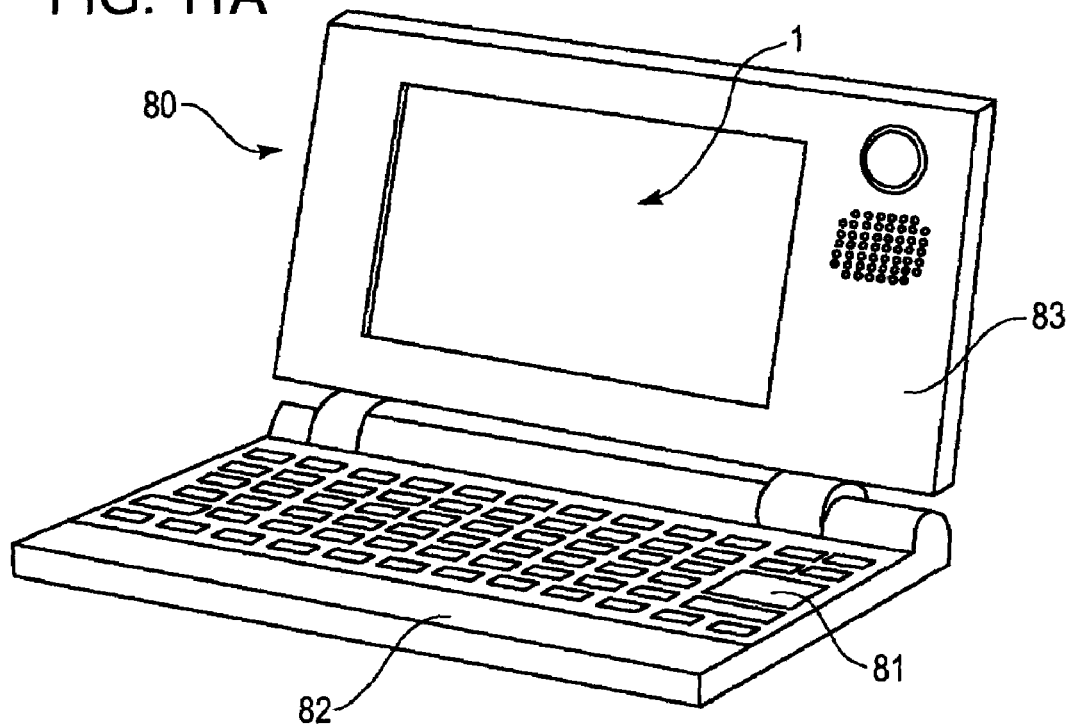
FIG. 11A is a diagram illustrating a mobile personal computer that uses an electro-optical device according to the invention.

FIG. 11A shows a mobile personal computer according to an example of an electronic apparatus of the invention. In FIG. 11A, a personal computer 80 includes a main body 82 having a keyboard 81, and a liquid crystal display unit 83. The liquid crystal display unit 83 includes the above-described liquid crystal device 100.

Figure 11B:
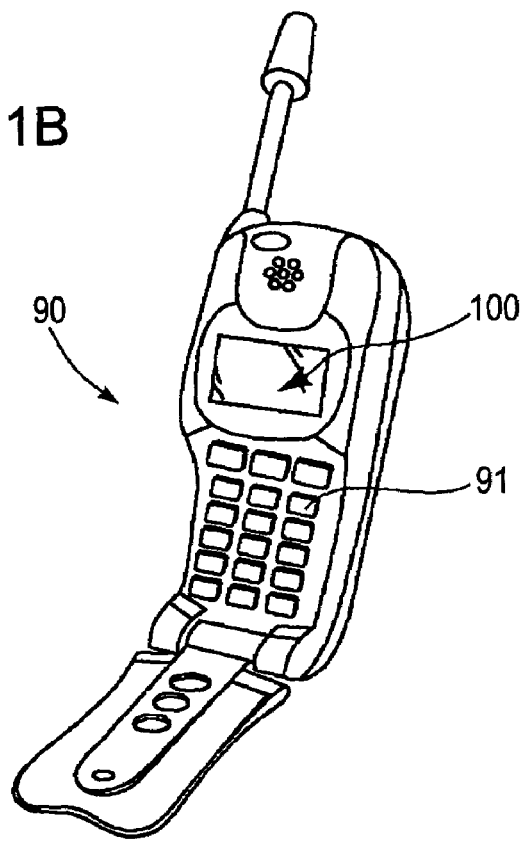
FIG. 11B is a diagram illustrating a cellular phone that uses an electro-optical device according to the invention.

FIG. 11B shows a cellular phone according to another example of an electronic apparatus of the invention. In FIG. 11B, a cellular phone 90 includes a plurality of operating buttons 91 and a display unit including the above-described liquid crystal device 100.

What is claimed is:
1. A thin-film semiconductor device comprising, on the same substrate:
a thin-film transistor, in which an active layer, a gate insulating film, and a gate electrode are laminated; and
a capacitive element, in which a first electrode formed using a semiconductor film formed on the same layer as the active layer, a dielectric film formed on the same layer as the gate insulating film, and a second electrode formed on the same layer as the gate electrode are laminated,
wherein, in the capacitive element, in plan view, the dielectric film has a first region that is formed in a region inside outer circumferences of the first and second electrodes and that has a film thickness smaller than that of the gate insulating film, and a second region that is formed in a region outside the first region and that has a film thickness larger than that of the first region.

2. The thin-film semiconductor device according to claim 1,
wherein a film thickness of the dielectric film in the second region is substantially equal to that of the gate insulating film.

3. The thin-film semiconductor device according to claim 1, wherein, in the capacitive element, in plan view, the second electrode is formed in a region inside the first electrode, and the first region is formed in a region inside the second electrode.

4. The thin-film semiconductor device according to claim 1, wherein, in the capacitive element, in plan view, the first electrode is formed in a region inside the second electrode, and the first region is formed in a region inside the first electrode.

5. The thin-film semiconductor device according to claim 1, wherein the thin-film transistor has the active layer, the gate insulating film, and the gate electrode, which are sequentially laminated on the substrate, and the capacitive element has the first electrode, the dielectric film, and the second electrode, which are sequentially laminated on the substrate.

6. An electro-optical device comprising:

the thin-film semiconductor device according to claim 1 as an electro-optical device substrate; and an electro-optical material that is held on the substrate for an electro-optical device.

7. The electro-optical device according to claim 6, wherein the electro-optical material is liquid crystal that is held between the substrate for an electro-optical device and a counter substrate disposed to face the substrate for an electro-optical device, and the thin-film transistor and the capacitive element are provided in each of a plurality of pixels disposed in a matrix shape.

8. The electro-optical device according to claim 6, wherein the electro-optical material is an organic electroluminescent material provided on the substrate for an electro-optical device, and the thin-film transistor and the capacitive element are provided in each of a plurality of pixels disposed in a matrix shape.

9. An electronic apparatus comprising the electro-optical device according to claim 6.

* * * * *